United States Patent
Tsukamoto et al.

(10) Patent No.: US 10,074,601 B2
(45) Date of Patent: Sep. 11, 2018

(54) WIRING SUBSTRATE AND SEMICONDUCTOR DEVICE

(71) Applicant: SHINKO ELECTRIC INDUSTRIES CO., LTD., Nagano-shi, Nagano-ken (JP)

(72) Inventors: Kosuke Tsukamoto, Nagano (JP); Noriyoshi Shimizu, Nagano (JP)

(73) Assignee: Shinko Electric Industries Co., Ltd. (JP)

( * ) Notice: Subject to any disclaimer, the term of this patent is extended or adjusted under 35 U.S.C. 154(b) by 0 days.

(21) Appl. No.: 15/624,080

(22) Filed: Jun. 15, 2017

(65) Prior Publication Data

US 2017/0372991 A1 Dec. 28, 2017

(30) Foreign Application Priority Data

Jun. 24, 2016 (JP) .................. 2016-125670

(51) Int. Cl.
*H01L 23/48* (2006.01)
*H01L 23/498* (2006.01)
*H01L 21/48* (2006.01)

(52) U.S. Cl.
CPC ...... *H01L 23/49822* (2013.01); *H01L 21/481* (2013.01); *H01L 21/486* (2013.01); *H01L 21/4857* (2013.01); *H01L 23/49811* (2013.01); *H01L 23/49827* (2013.01); *H01L 23/49838* (2013.01)

(58) Field of Classification Search
CPC ......... H01L 23/49822; H01L 23/49811; H01L 21/481; H01L 2/486; H01L 23/49827; H01L 23/49838; H01L 21/4857
See application file for complete search history.

(56) References Cited

U.S. PATENT DOCUMENTS

| | | | | |
|---|---|---|---|---|
| 2005/0263905 | A1* | 12/2005 | Usui | H01L 21/486 257/774 |
| 2006/0001166 | A1* | 1/2006 | Igarashi | H01L 23/3128 257/758 |
| 2014/0290997 | A1* | 10/2014 | Maeda | H01L 23/49822 174/258 |
| 2014/0311771 | A1* | 10/2014 | Shimizu | H01L 23/5383 174/251 |
| 2015/0282307 | A1* | 10/2015 | Shimizu | H01L 24/13 174/264 |

FOREIGN PATENT DOCUMENTS

JP 2014-225632 A 12/2014

* cited by examiner

*Primary Examiner* — Ahmed Sefer
(74) *Attorney, Agent, or Firm* — Tarolli, Sundheim, Covell & Tummino LLP

(57) ABSTRACT

A wiring substrate includes a first wiring layer, an insulative resin first insulation layer covering the first wiring layer, and a second wiring layer located on an upper surface of the first insulation layer. A via wiring layer, which extends through the first insulation layer to connect the first and second wiring layers, includes an upper end surface connected to the second wiring layer and flush with the upper surface of the first insulation layer. The second wiring layer has a higher wiring density than the first wiring layer. The first insulation layer includes a first resin layer and a second resin layer located on an upper surface of the first resin layer and having a lower filler content rate than the first resin layer. The upper surface of the first resin layer is a curved surface upwardly curved toward the upper end surface of the via wiring layer.

6 Claims, 11 Drawing Sheets

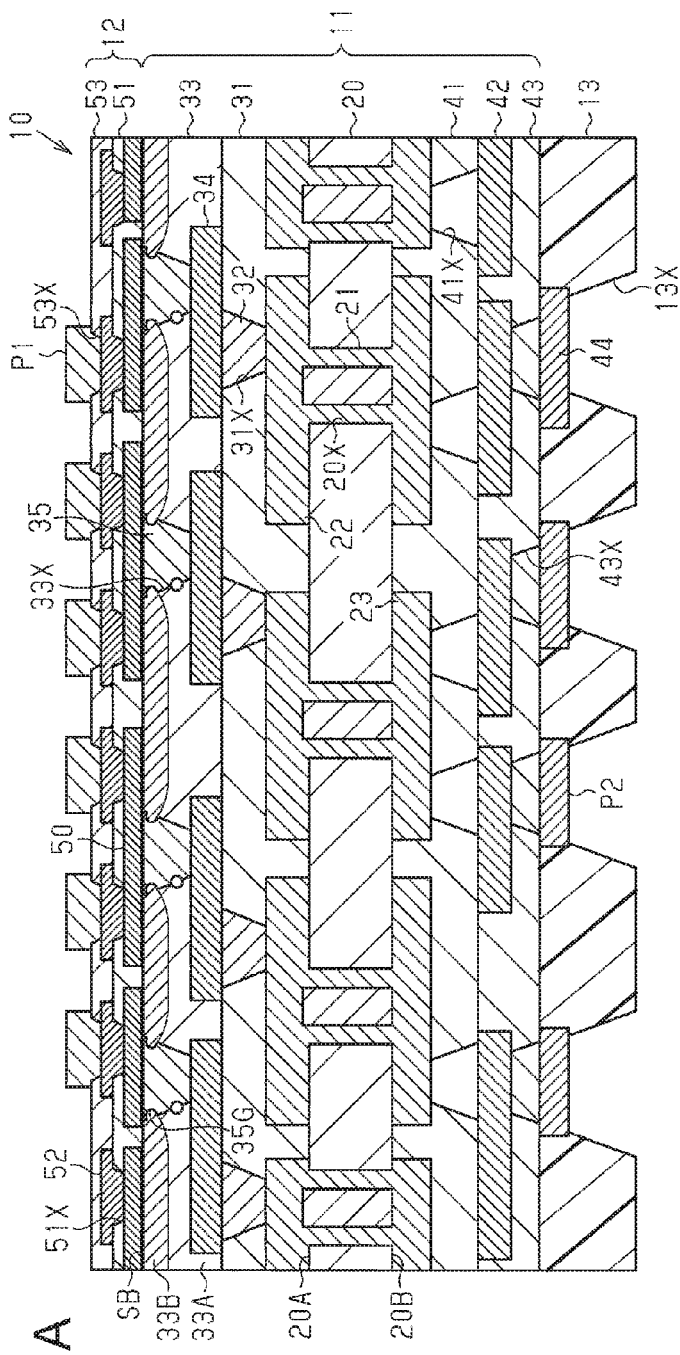
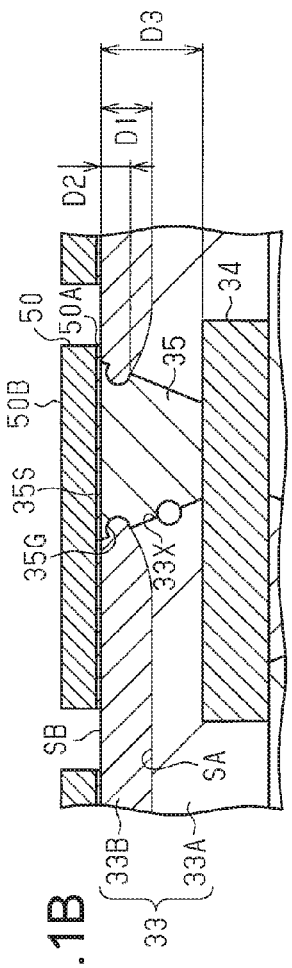
Fig.1A
Fig.1B

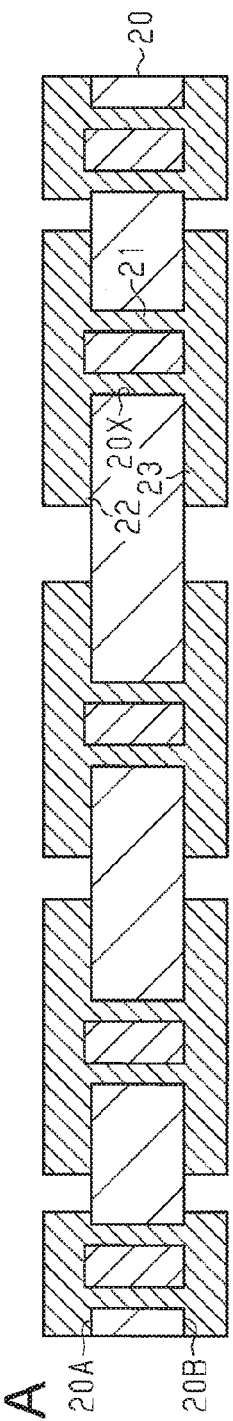
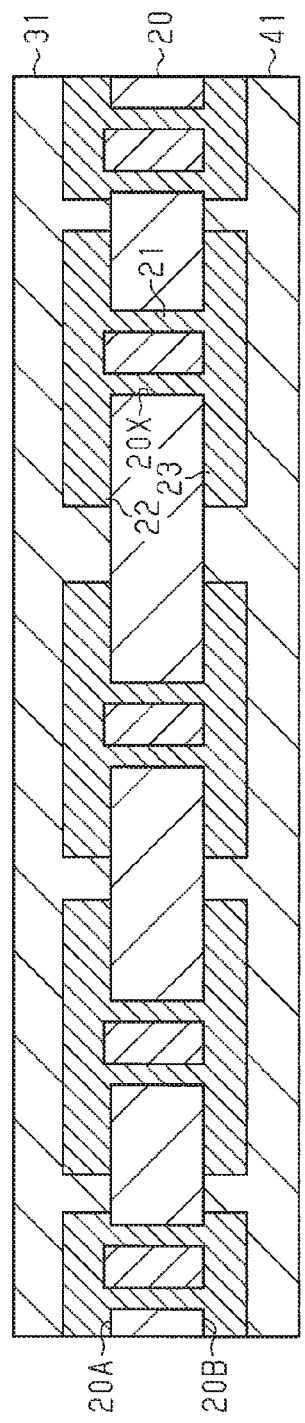

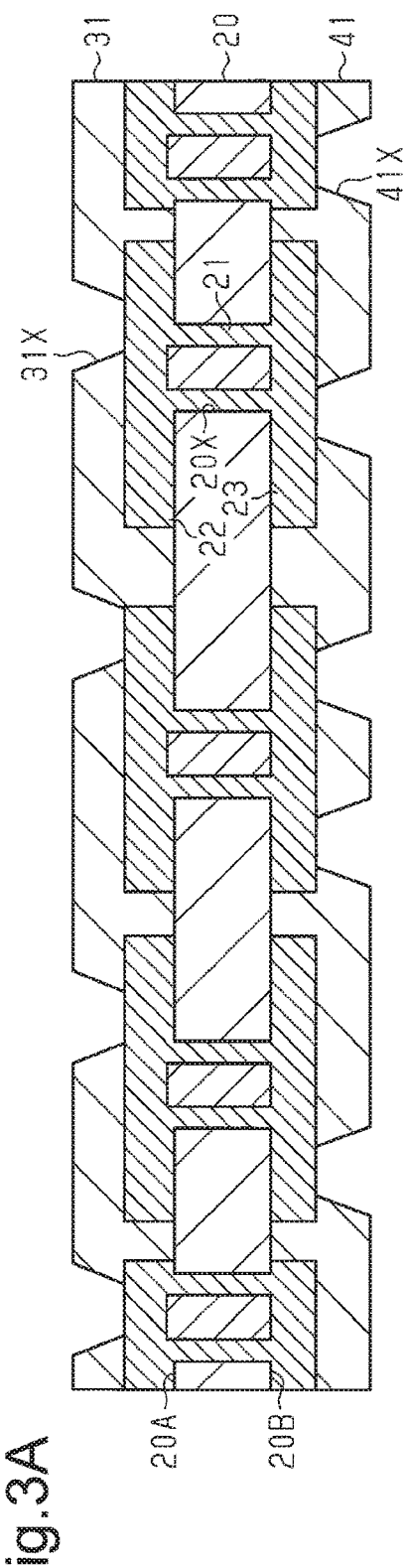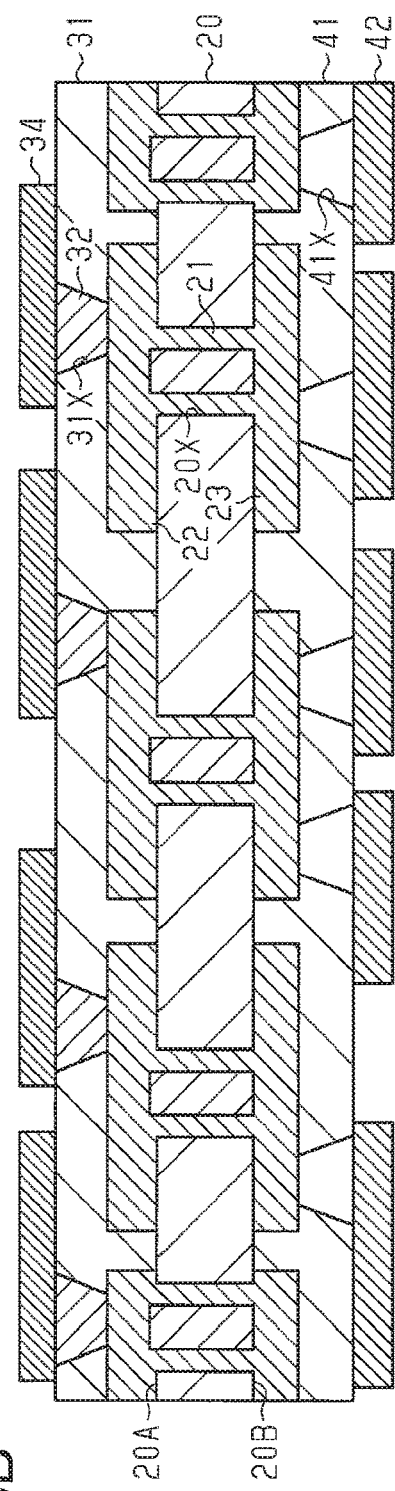

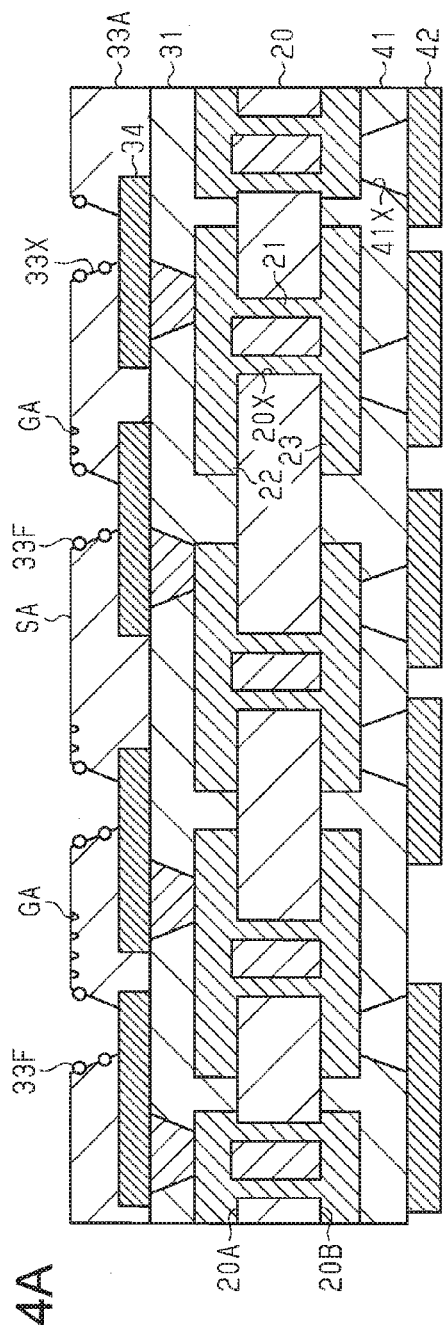
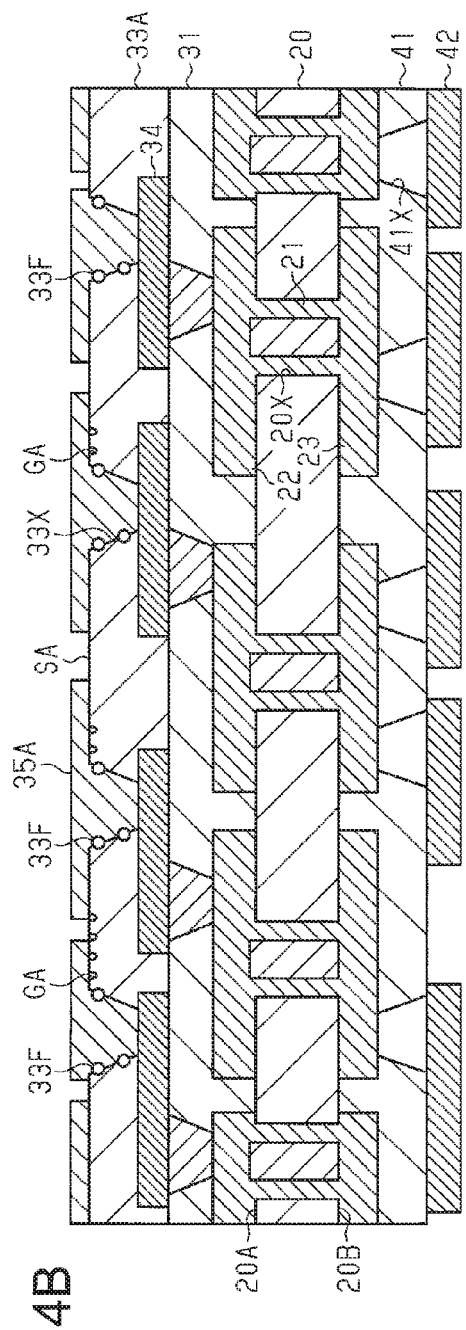
Fig.4A
Fig.4B

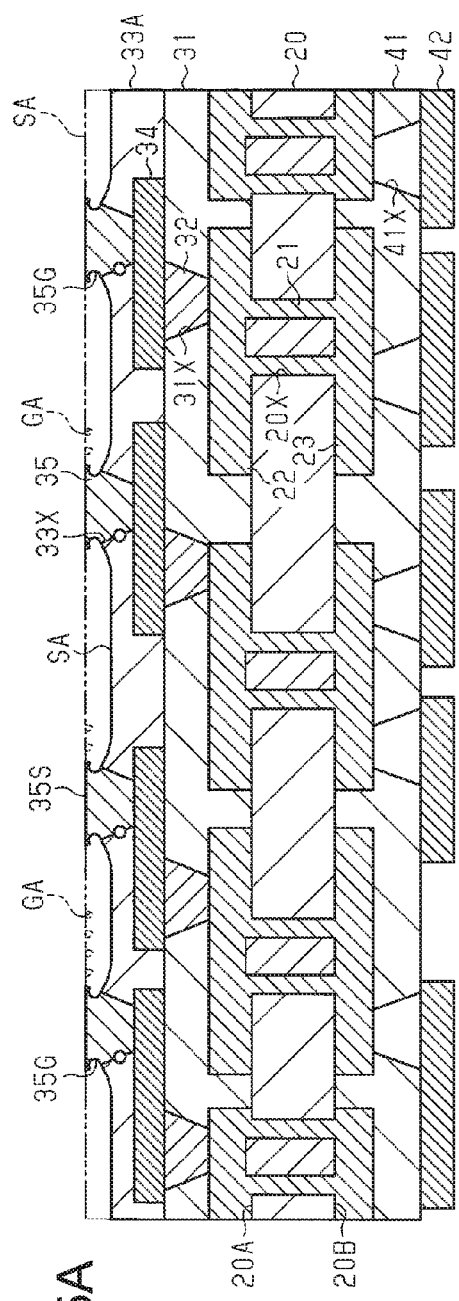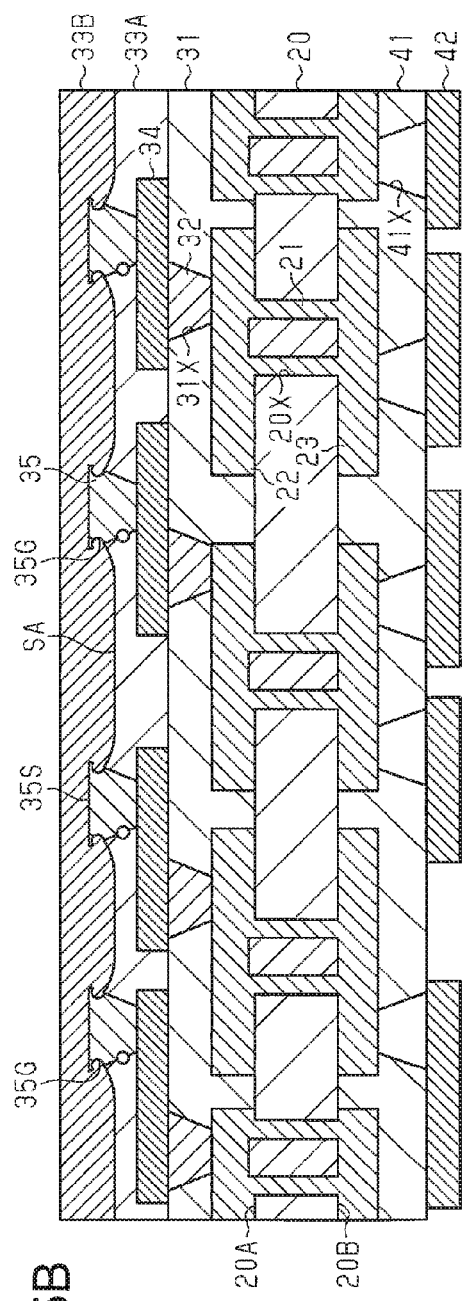

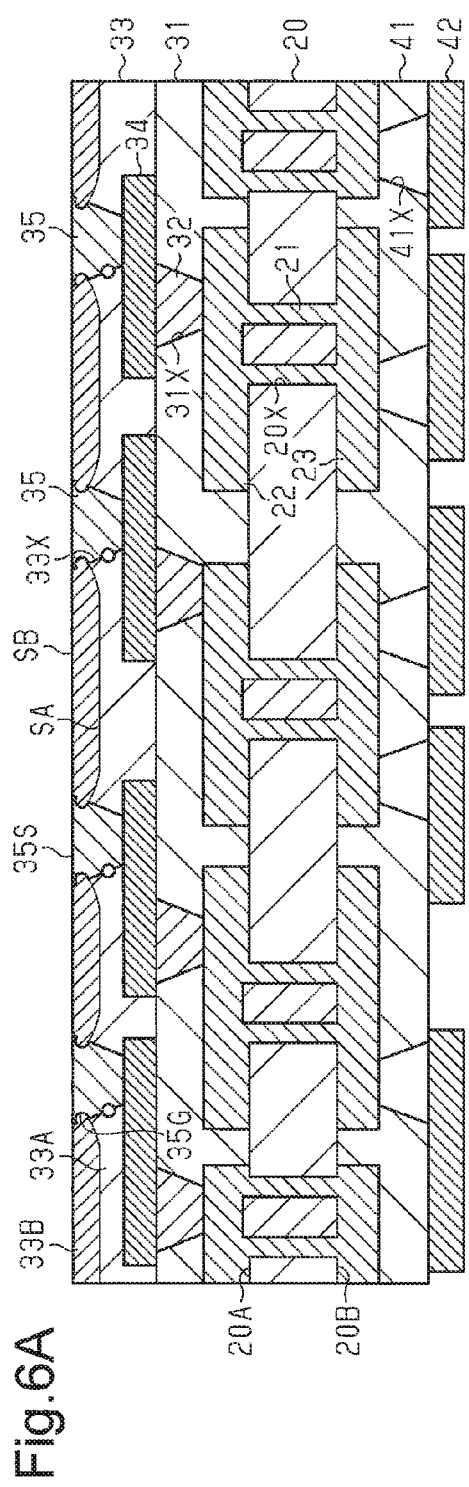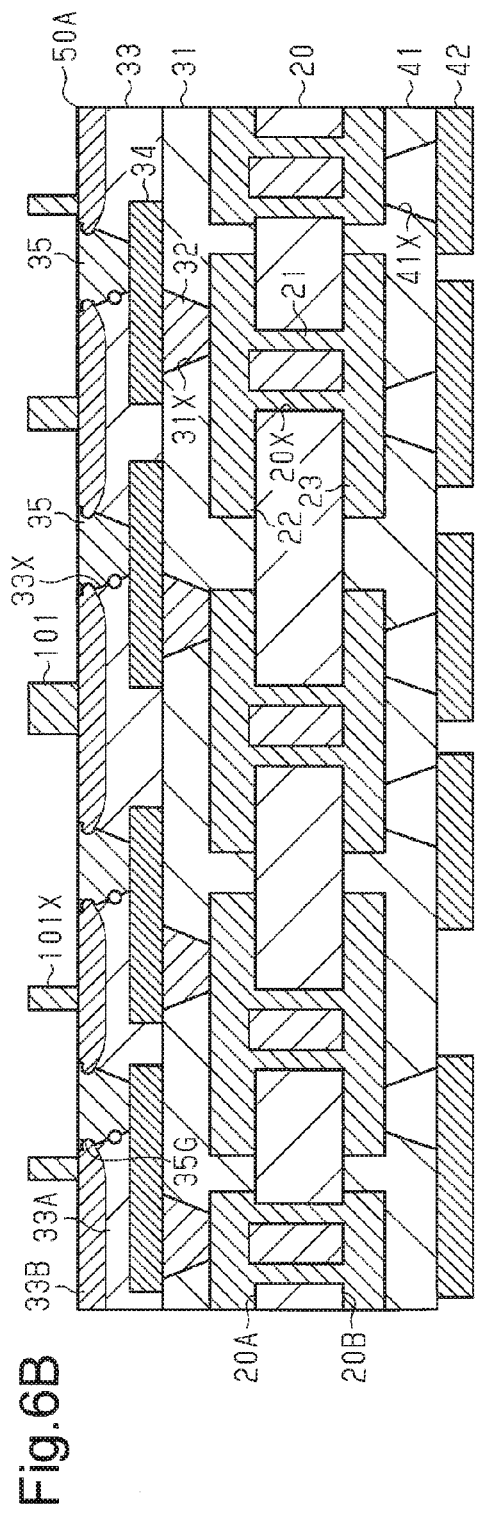

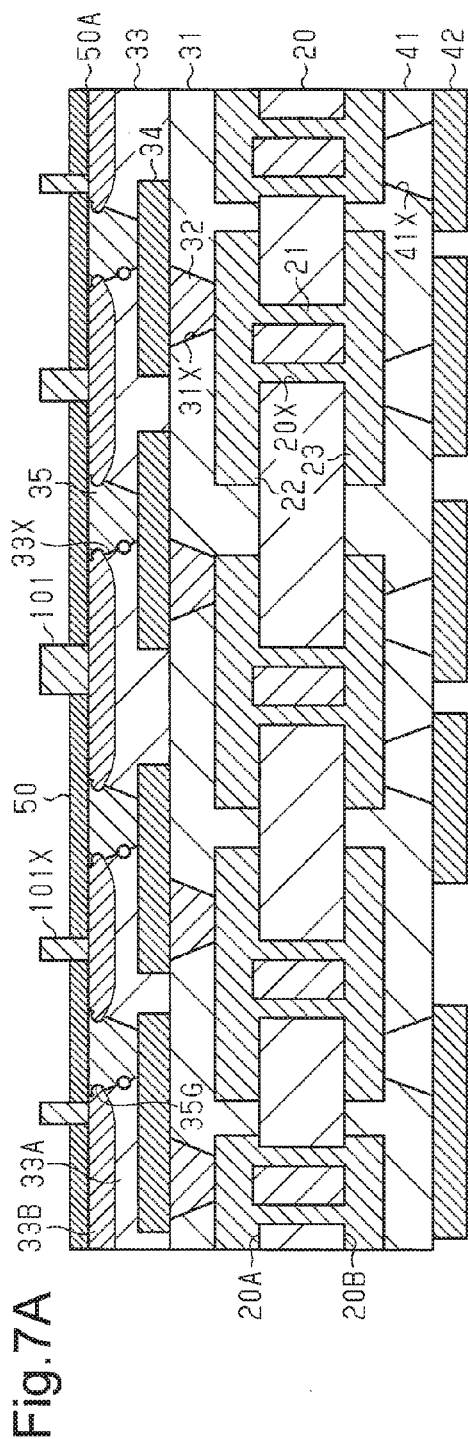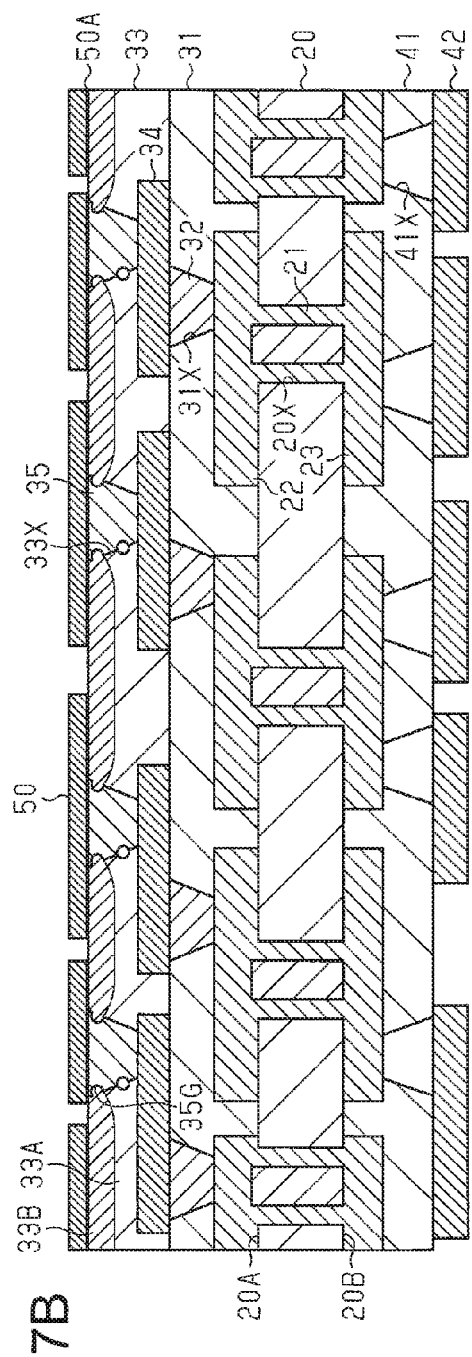

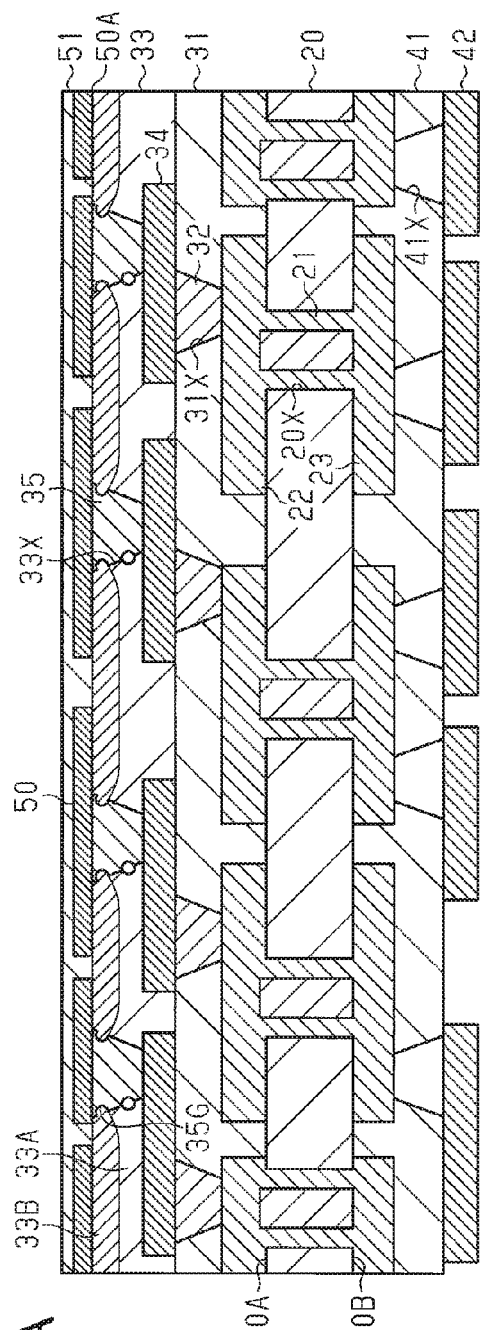
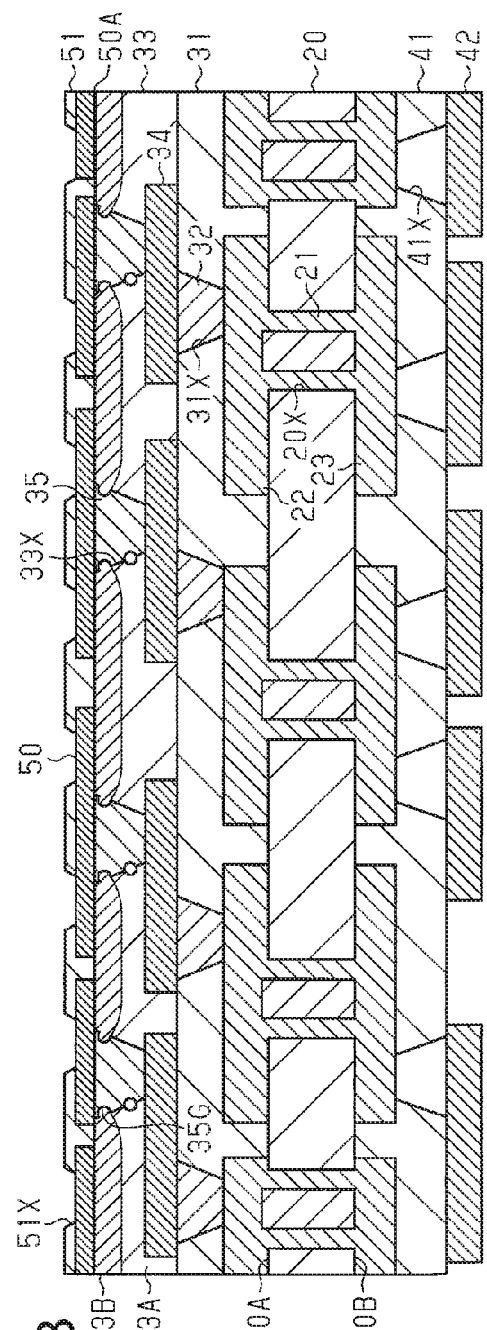
Fig.8A
Fig.8B (Reference Example)

WIRING SUBSTRATE AND SEMICONDUCTOR DEVICE

CROSS-REFERENCE TO RELATED APPLICATIONS

This application is based upon and claims the benefit of priority from prior Japanese Patent Application No. 2016-125670, filed on Jun. 24, 2016, the entire contents of which are incorporated herein by reference.

FIELD

This disclosure relates to a wiring substrate, a semiconductor device, and a method for manufacturing a wiring substrate.

BACKGROUND

A wiring substrate couples electronic components such as semiconductor chips to a device. Electronic components have become highly integrated and highly sophisticated. Thus, there is a need to increase the density of wiring in wiring substrates. Japanese Laid-Open Patent Publication No. 2014-225632 describes one example of a wiring substrate that increases the wiring density. The wiring substrate described in the publication includes a core substrate, a first wiring layer formed on the core substrate, a first insulation layer covering the first wiring layer, a second wiring layer having a higher wiring density than the first wiring layer and formed on the first insulation layer, and a second insulation layer covering the first insulation layer and the second wiring layer.

Such a wiring substrate includes via holes that extend through the first insulation layer, which is located between the first wiring layer and the second wiring layer, from the first wiring layer to the second wiring layer. The via holes are filled with a via wiring layer that electrically connects the first wiring layer and the second wiring layer.

The step of forming the via holes includes laser processing performed on the first insulation layer and desmear processing performed on the first insulation layer after the laser processing is performed. The laser processing exposes a surface of the first wiring layer in the bottom of each via hole. The desmear processing removes residues of the first insulation layer from the exposed surface of the first wiring layer. The step of forming the via wiring layer includes a process for embedding a conductive material in the via holes and a process for polishing the conductive material. The embedding process fills the via holes with the conductive material and deposits the conductive material on the surface of the first insulation layer. The polishing process removes the deposited conductive material from the surface of the first insulation layer to form an end surface of the via wiring layer that is flush with the surface of the first insulation layer. Since the second wiring layer has a higher wiring density than the first wiring layer, the base layer for the second wiring layer needs to have a high level of flatness. The polishing process of the conductive material realizes such a high level of flatness.

The desmear processing roughens the surface of the first insulation layer. Thus, in the embedding process performed after the desmear processing, the conductive material is embedded in recesses that were formed in the surface of the first insulation layer when the desmear processing was performed. The conductive material remains in the recesses of the surface of the first insulation layer after the polishing process is performed on the conductive material. Consequently, the conductive material remaining in the recesses may short-circuit wirings in the second wiring layer formed on the surface of the first insulation layer. This hinders increases of the throughput yield.

SUMMARY

One embodiment is a wiring substrate that includes a first wiring layer, a first insulation layer that is formed from an insulative resin and covers the first wiring layer, a second wiring layer located on an upper surface of the first insulation layer, a second insulation layer that is formed from an insulative resin and covers the first insulation layer and the second wiring layer, and a via wiring layer that extends through the first insulation layer and connects the first wiring layer to the second wiring layer. The via wiring layer includes an upper end surface that is connected to the second wiring layer and flush with the upper surface of the first insulation layer. The second wiring layer has a higher wiring density than the first wiring layer. The first insulation layer includes a first resin layer that contains a filler, and a second resin layer that is located on an upper surface of the first resin layer and has a lower filler content rate than the first resin layer. An upper surface of the second resin layer is the upper surface of the first insulation layer. The upper surface of the first resin layer is a curved surface that is upwardly curved toward the upper end surface of the via wiring layer.

Other embodiments and advantages thereof will become apparent from the following description, taken in conjunction with the accompanying drawings, illustrating by way of example the principles of the invention.

It is to be understood that both the foregoing general description and the following detailed description are exemplary and explanatory and are not restrictive of the invention, as claimed.

BRIEF DESCRIPTION OF THE DRAWINGS

The embodiments, together with objects and advantages thereof, may best be understood by reference to the following description of the presently preferred embodiments together with the accompanying drawings in which:

FIG. 1A is a schematic cross-sectional view illustrating the structure of one embodiment of a wiring substrate;

FIG. 1B is a partially enlarged cross-sectional view of the wiring substrate illustrated in FIG. 1A;

FIGS. 2A, 2B, 3A, 3B, 4A, 4B, 5A, 5B, 6A, 6B, 7A, 7B, 8A, 8B, and 9 are cross-sectional views illustrating the steps for manufacturing the wiring substrate of FIG. 1A;

DESCRIPTION OF THE EMBODIMENTS

Figure 9:
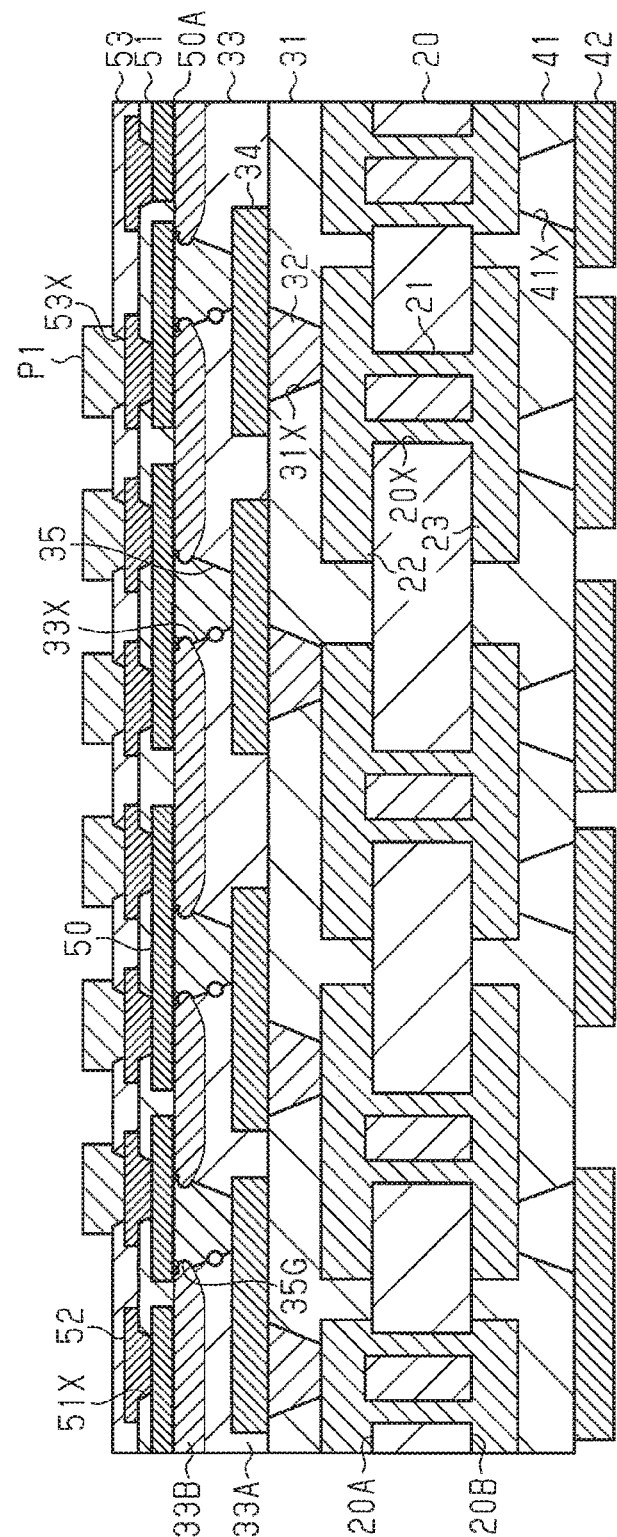

One embodiment will now be described with reference to the accompanying drawings. Elements in the drawings may be partially enlarged for simplicity and clarity and thus have not necessarily been drawn to scale.

A wiring substrate 10 includes wiring structures 11, 12. The wiring structure 11 will first be described.

As illustrated in FIG. 1A, the wiring structure 11 includes a low density wiring layer, which has a lower wiring density than the wiring structure 12. A core substrate 20 is located substantially in the middle of the wiring structure 11 in the thickness-wise direction.

The core substrate 20 is, for example, a glass-epoxy substrate, which is a composite of a reinforcement material and a cured thermosetting insulative resin, with which the reinforcement material is impregnated. The reinforcement material is, for example, a glass cloth (glass woven cloth), a glass non-woven cloth, an aramid woven cloth, an aramid non-woven cloth, a liquid crystal polymer (LCP) woven cloth, or an LCP non-woven cloth. The thermosetting insulative resin is, for example, an epoxy resin, a polyimide resin, or a cyanate resin. The core substrate 20 may contain, for example, a filler such as silica or alumina. The thickness of the core substrate 20 is, for example, 80 μm or greater and 800 μm or less.

The core substrate 20 includes through holes 20X in given locations. Each of the through holes 20X extends through the core substrate 20 from an upper surface 20A of the core substrate 20 to a lower surface 20B of the core substrate 20. Through electrodes 21 are located in the through holes 20X extending through the core substrate 20 in the thickness-wise direction. In the present example, the through holes 20X are filled with the through electrodes 21. The through holes 20X are each, for example, a circular hole having a diameter of 50 μm or greater and 100 μm or less in a plan view. Pitches of the through holes 20X are, for example, 100 μm or greater and 200 μm or less. The material of the through electrodes 21 is, for example, copper or a copper alloy.

A wiring layer 22 is located on the upper surface 20A of the core substrate 20. A wiring layer 23 is located on the lower surface 20B of the core substrate 20. The wiring layers 22, 23 are electrically connected to each other by the through electrodes 21. The material of the wiring layers 22, 23 is, for example, copper or a copper alloy. The thickness of each of the wiring layers 22, 23 is, for example, 15 μm or greater and 35 μm or less. The line and space (L/S) of each of the wiring layers 22, 23 is, for example, 20 μm/20 μm. The line and space corresponds to the width of a wiring and the interval of wirings that are adjacent to each other.

An insulation layer 31, a via wiring layer 32, an insulation layer 33, a wiring layer 34, and a via wiring layer 35 are stacked on the upper surface 20A of the core substrate 20. The insulation layer 33 is one example of a first insulation layer.

The insulation layer 31 covers the upper surface 20A of the core substrate 20 and the wiring layer 22. The insulation layer 31 includes through holes 31X in given locations. The through holes 31X each extend through the insulation layer 31 in the thickness-wise direction to partially expose an upper surface of the wiring layer 22.

The wiring layer 34 is located on an upper surface of the insulation layer 31. The wiring layer 34 is electrically connected to the wiring layer 22 by the via wiring layer 32, which fills the through holes 31X. The wiring layer 34 may be separate from or integrated with the via wiring layer 32, which fills the through holes 31X.

The insulation layer 33 covers the upper surface of the insulation layer 31 and the wiring layer 34. The insulation layer 33 includes through holes 33X in given locations. The through holes 33X each extend through the insulation layer 33 in the thickness-wise direction to partially expose an upper surface of the wiring layer 34.

The insulation layer 33 includes an upper surface SB, which is a smooth surface having few irregularities and has a low roughness. The upper surface SB of the insulation layer 33 has, for example, a lower roughness than the wall surface of each through hole 33X. The upper surface SB of the insulation layer 33 has a surface roughness value Ra of, for example, 15 nm or greater and 40 nm or less. The wall surface of each through hole 33X has a surface roughness value Ra of, for example, 300 nm or greater and 400 nm or less. The surface roughness value Ra is referred to as the arithmetic mean roughness and, more specifically, is obtained by calculating an arithmetic mean of absolute values of height that changes from a surface defining the mean line within a measurement region.

The through holes 31X, 33X are each tapered so that the diameter is gradually decreased from the upper side toward the lower side in FIG. 1A (in direction extending from wiring structure 12 toward core substrate 20). In the present example, the through holes 31X, 33X each have the form of an inverted truncated cone so that the upper end opening has a larger diameter than the lower end opening. The upper end opening of each of the through holes 31X, 33X has a diameter of, for example, 60 μm or greater and 70 μm or less.

The material of the insulation layers 31, 33 is, for example, a non-photosensitive insulative resin, the main component of which is a thermosetting resin such as an epoxy resin or a polyimide resin. The insulation layers 31, 33 each include, for example, a filler such as silica or alumina.

The material of the wiring layer 34 and the via wiring layers 32, 35 is, for example, copper or a copper alloy. The thickness of each of the insulation layers 31, 33 is, for example, 20 μm or greater and 45 μm or less. The thickness of the wiring layer 34 is, for example, 15 μm or greater and 35 μm or less. The line and space (L/S) of the wiring layer 34 is, for example, 20 μm/20 μm.

As illustrated in FIG. 1B, the via wiring layer 35 is located in the through hole 33X. The via wiring layer 35 is electrically connected to the wiring layer 34 and a wiring layer 50, which is located on the upper surface SB of the insulation layer 33. The via wiring layer 35 electrically connects the low density wiring layer (in present example, wiring layer 34) to a high density wiring layer (in present example, wiring layer 50). The wiring layer 34 is one example of a first wiring layer. The wiring layer 50 is one example of a second wiring layer.

The via wiring layer 35 is the uppermost wiring layer among the wiring layers in the wiring structure 11. The via wiring layer 35 extends through the insulation layer 33 in the thickness-wise direction. In the same manner as the through holes 33X, the via wiring layer 35 is tapered so that the diameter is gradually decreased from the upper side toward the lower side in FIG. 1B (in direction extending from wiring layer 50 toward wiring layer 34). In the present example, the via wiring layer 35 has the form of an inverted truncated cone so that an upper end surface 35S of the via wiring layer 35 has a larger diameter than a lower end surface of the via wiring layer 35. The upper end surface 35S of the via wiring layer 35 is exposed from the insulation layer 33 in the upper surface SB of the insulation layer 33. The upper end surface 35S of the via wiring layer 35 is flush with the upper surface SB of the insulation layer 33. The upper end surface 35S of the via wiring layer 35 is directly joined to a lower surface of the wiring layer 50. The via wiring layer 35 includes a side surface that includes recesses 35G. Each of the recesses 35G is shaped in conformance with a portion of the peripheral surface of the filler contained in the insulation layer 33 and, for example, a semispherical surface. The diameter of the upper end surface 35S of the via wiring layer 35 is, for example, 60 μm or greater and 70 μm or less.

The insulation layer 33 includes a first resin layer 33A and a second resin layer 33B. The first resin layer 33A is a portion of the insulation layer 33 that covers the wiring layer 34 and surrounds the via wiring layer 35. The first resin layer 33A includes an upper surface SA, which is located at a lower position than the upper surface SB of the insulation layer 33 (in direction extending from upper end surface 35S of via wiring layer 35 toward wiring layer 34). That is, the upper surface SA of the first resin layer 33A is located between the upper end surface 35S of the via wiring layer 35 and the upper surface of the wiring layer 34.

The upper surface SA of the first resin layer 33A is a curved surface that is upwardly curved toward the upper end surface 35S of the via wiring layer 35 around the via wiring layer 35. In other words, the upper surface SA of the first resin layer 33A is a curved surface that is located further downward (in direction extending from upper end surface 35S of via wiring layer 35 toward wiring layer 34) at positions further separated from the via wiring layer 35 around the via wiring layer 35. The upper surface SA of the first resin layer 33A is a polished surface formed by polishing the first resin layer 33A. The upper surface SA of the first resin layer 33A is located at a lower position than the recesses 35G at the side surface of the via wiring layer 35.

The second resin layer 33B is located on the upper surface SA of the first resin layer 33A. The second resin layer 33B is a portion of the insulation layer 33 that covers the via wiring layer 35. The recesses 35G in the via wiring layer 35 are filled with the second resin layer 33B. The second resin layer 33B has a lower content rate of the filler than the first resin layer 33A. To increase the adhesiveness of the first resin layer 33A and the second resin layer 33B, it is preferred that the material of the first resin layer 33A and the material of the second resin layer 33B be a thermosetting insulative resin composition that contains the same component. Additionally, to increase the adhesiveness of the second resin layer 33B and an insulation layer 51, it is preferred that the material of the second resin layer 33B and material of the insulation layer 51 be an insulative resin that contains the same component. To limit the separation of the filler from an upper surface of the second resin layer 33B, it is preferred that the filler content rate of the second resin layer 33B be zero. The upper surface of the second resin layer 33B corresponds to the upper surface SB of the insulation layer 33 and is flush with the upper end surface 35S of the via wiring layer 35.

The distance between the upper surface SA of the first resin layer 33A and the upper surface SB of the insulation layer 33 in the thickness-wise direction of the insulation layer 33 corresponds to the thickness of the second resin layer 33B and is represented by a second resin thickness D1. The second resin thickness D1 increases at positions further separated from the via wiring layer 35 and decreases at positions closer to the via wiring layer 35 around the via wiring layer 35. The maximum value of the second resin thickness D1 is, for example, 1 μm or greater and 5 μm or less.

The minimum value of the second resin thickness D1 is represented by a minimum resin thickness D2 and is zero or greater. The uppermost portion of the upper surface SA of the first resin layer 33A is located at a position proximate to the via wiring layer 35. Additionally, the uppermost portion of the upper surface SA of the first resin layer 33A is located at the same position as the upper end surface 35S of the via wiring layer 35 or a lower position than the upper end surface 35S of the via wiring layer 35 in the thickness-wise direction of the insulation layer 33. In FIG. 1B, to illustrate the minimum resin thickness D2, the uppermost portion of the upper surface SA of the first resin layer 33A is located at a lower position than the upper end surface 35S of the via wiring layer 35.

The distance between the upper surface SB of the insulation layer 33 and the upper surface of the wiring layer 34 in the thickness-wise direction of the insulation layer 33 corresponds to the thickness-wise direction of the via wiring layer 35 and is represented by a via thickness D3. The via thickness D3 is sufficiently greater than the second resin thickness D1.

As illustrated in FIG. 1A, the insulation layer 41, the wiring layer 42, the insulation layer 43, and the wiring layer 44 are stacked on the lower surface 20B of the core substrate 20. The material of the insulation layers 41, 43 is, for example, a non-photosensitive insulative resin, the main component of which is a thermosetting resin such as an epoxy resin or a polyimide resin. The insulation layers 41, 43 each contain, for example, a filler such as silica or alumina. The material of the wiring layers 42, 44 is, for example, copper or a copper alloy. The thickness of each of the insulation layers 41, 43 is, for example, 20 μm or greater and 45 μm or less. The thickness of each of the wiring layers 42, 44 is, for example, 15 μm or greater and 35 μm or less. The line and space (L/S) of each of the wiring layers 42, 44 is, for example, 20 μm/20 μm.

The insulation layer 41 covers the lower surface 20B of the core substrate 20 and the wiring layer 23. The insulation layer 41 includes through holes 41X in given locations. The through holes 41X each extend through the insulation layer 41 in the thickness-wise direction to partially expose a lower surface of the wiring layer 23.

The wiring layer 42 is located on a lower surface of the insulation layer 41. The wiring layer 42 is electrically connected to the wiring layer 23 by a via wiring layer that fills the through holes 41X. The wiring layer 42 may be, for example, separate from or integrated with the via wiring layer filling the through holes 41X.

The insulation layer 43 covers the lower surface of the insulation layer 41 and the wiring layer 42. The insulation layer 43 includes through holes 43X in given locations. The through holes 43X each extend through the insulation layer 43 in the thickness-wise direction to partially expose a lower surface of the wiring layer 42.

The through holes 41X, 43X are each tapered so that the diameter is gradually decreased from the lower side to the upper side in FIG. 1A (in direction extending from solder resist layer 13 toward core substrate 20). In the present example, the through holes 41X, 43X each have the form of a truncated cone so that the lower end opening has a larger diameter than the upper end opening. The lower end opening of each of the through holes 41X, 43X is, for example, 60 μm or greater and 70 μm or less.

The wiring layer 44 is located on a lower surface of the insulation layer 43. The wiring layer 44 is the lowermost wiring layer among the wiring layers in the wiring structure 11. The wiring layer 44 is electrically connected to the wiring layer 42 by a via wiring layer that fills the through holes 43X. The wiring layer 44 may be, for example, separate from or integrated with the via wiring layer filling the through holes 43X.

The wiring structure 12 will now be described.

As illustrated in 1A, the wiring structure 12 includes the high density wiring layer, which has a higher wiring density than the wiring structure 11. The wiring structure 12 includes the wiring layer 50, the insulation layer 51, a wiring layer 52, and an insulation layer 53, which are stacked on the upper surface SB of the insulation layer 33. The wiring layer 50 is one example of a second wiring layer. The insulation layer 51 is one example of a second insulation layer. The wiring layer 50 is the lowermost wiring layer among the wiring layers in the wiring structure 12. The thickness of the wiring structure 12, that is, from the upper surface SB of the insulation layer 33 to an upper surface of the insulation layer 53, is, for example, 20 μm or greater and 40 μm or less.

The material of the wiring layers 50, 52 is, for example, copper or a copper alloy. The material of the insulation layers 51, 53 is, for example, a photosensitive insulative resin, the main component of which is a phenol resin or a polyimide resin. The insulation layers 51, 53 each contain, for example, a filler such as silica or alumina.

The wiring layers 50, 52 are finer than each wiring layer of the wiring structure 11. The line and space (L/S) of each of the wiring layers 50, 52 is, for example, less than 10 μm/10 μm. The wiring layers 50, 52 are thinner than each wiring layer of the wiring structure 11. The thickness of each of the wiring layers 50, 52 is, for example, 1 μm or greater and 3 μm or less. The insulation layers 51, 53 are thinner than each insulation layer of the wiring structure 11. The thickness of each of the insulation layers 51, 53 is, for example, 5 μm or greater and 10 μm or less.

The wiring layers 50, 52 each have a lower surface roughness than each wiring layer of the wiring structure 11. The surface roughness value Ra of each of the wiring layers 50, 52 is, for example, 1 nm or greater and 10 nm or less. The surface roughness value Ra of each of the wiring layers 22, 34 of the wiring structure 11 is, for example, 100 nm or greater and 300 nm or less.

As illustrated in FIG. 1B, the wiring layer 50 is located on the upper surface SB of the insulation layer 33 and connected to the upper end surface 35S of the via wiring layer 35. When the lower surface of the wiring layer 50 is partially in contact with the upper end surface 35S of the via wiring layer 35, the wiring layer 50 is electrically connected to the via wiring layer 35. Although the wiring layer 50 and the via wiring layer 35 are electrically connected to each other, they are not integrated with each other. The wiring layer 50 includes, for example, a seed layer 50A, which is located on the upper end surface 35S of the via wiring layer 35, and a metal layer 50B, which is located on an upper surface of the seed layer 50A. The metal layer 50B is electrically connected to the via wiring layer 35 by the seed layer 50A.

The seed layer 50A covers the upper end surface 35S of the via wiring layer 35 and the upper surface SB of the insulation layer 33, which is located around the upper end surface 35S. The seed layer 50A is located between the metal layer 50B and the upper surface SB of the insulation layer 33 and also between the metal layer 50B and the upper end surface 35S of the via wiring layer 35. The seed layer 50A has, for example, a lamination structure of two layers of a titanium layer and a copper layer formed on the upper surface of the titanium layer. The thickness of the titanium layer is, for example, 20 nm or greater and 50 nm or less. The thickness of the copper layer is, for example, 100 nm or greater and 300 nm or less. The titanium layer functions as an adhesion layer that ensures the adhesiveness of the insulation layer 33 and the metal layer 50B. The material of the adhesion layer is, for example, titanium nitride, tantalum nitride, tantalum, or chromium other than titanium. The metal layer 50B covers the entire upper surface of the seed layer 50A. The metal layer 50B is, for example, an electrolytic plating metal layer formed through electrolytic plating. The material of the metal layer 50B is, for example, copper or a copper alloy.

The insulation layer 51 includes through holes 51X in given locations. The through holes 51X each extend through the insulation layer 51 in the thickness-wise direction to partially expose an upper surface of the wiring layer 50. The wiring layer 52 is located on an upper surface of the insulation layer 51. The wiring layer 52 is electrically connected to the wiring layer 50 by a via wiring layer that fills the through holes 51X. The wiring layer 52 may be, for example, separate from or integrated with the via wiring layer filling the through holes 51X.

The insulation layer 53 is located on the upper surface of the insulation layer 51 to cover the wiring layer 52. The insulation layer 53 includes through holes 53X in given locations. The through holes 53X each extend through the insulation layer 53 in the thickness-wise direction to partially expose an upper surface of the wiring layer 52.

Pads P1 are located on the upper surface of the insulation layer 53. Each of the pads P1 is electrically connected to separate wiring patterns of the wiring layer 52 by a via wiring layer that fills the through holes 53X. The pads P1 each function as an electronic component mount pad that is electrically connected to an electronic component such as a semiconductor chip.

The through holes 51X, 53X are each tapered so that the diameter is gradually decreased from the upper side to the lower side in FIG. 1A (in direction extending from insulation layer 53 toward wiring structure 11). In the present example, the through holes 51X, 53X each have the form of an inverted truncated cone so that the upper end opening has a larger diameter than the lower end opening. The upper end opening of each of the through holes 51X, 53X is, for example, 10 μm or greater and 20 μm or less.

Each of the pads P1 may have any planar shape and any planar size. The planar shape of each pad P1 is, for example, circular and has a diameter of 20 μm or greater and 30 μm or less. Pitches of the pads P1 are, for example, 40 μm or greater and 60 μm or less.

The solder resist layer 13 is the lowermost insulation layer (outermost insulation layer) in the wiring substrate 10. The solder resist layer 13 covers the lower surface of the lowermost insulation layer 43 and the lowermost wiring layer 44 of the wiring structure 11. The solder resist layer 13 includes openings 13X. Each opening 13X exposes a portion of the lowermost wiring layer 44 as an external connection pad P2. The external connection pad P2 is connected to an external connection terminal such as a solder ball or a lead pin.

The external connection pads P2 and the openings 13X may have any planar shape and any planar size. The planar shape of each of the external connection pads P2 and the openings 13X is, for example, circular and has a diameter of 200 μm or greater and 300 μm or less. The material of the solder resist layer 13 is, for example, a photosensitive insulative resin, the main component of which is a phenol resin or a polyimide resin. The solder resist layer 13 may contain, for example, a filler such as silica or alumina.

The thickness of the solder resist layer 13 is, for example, greater than or equal to the thickness of the wiring structure 12. The thickness of the solder resist layer 13 is appropriately changed to reduce the warping amount of the wiring substrate 10.

A method for manufacturing the wiring substrate 10 will now be described.

The insulation layer 43 and the wiring layer 44 are formed by repeating the steps illustrated in FIGS. 3A and 3B. Thus, FIGS. 4A to 9 do not illustrate the insulation layer 43 and the through holes 43X.

In the step of FIG. 2A, the through holes 20X are formed in a copper clad laminate (CCL), which is used as the core substrate 20. The through electrodes 21 are formed in the through holes 20X through a process such as electrolytic plating or paste filling. Then, a subtractive process is performed to form the wiring layer 22 on the upper surface 20A of the core substrate 20 and form the wiring layer 23 on the lower surface 20B of the core substrate 20.

In the step of FIG. 2B, the insulation layer 31 is formed to cover the upper surface 20A of the core substrate 20 and the wiring layer 22. Also, the insulation layer 41 is formed to cover the lower surface 20B of the core substrate 20 and the wiring layer 23.

For example, when the insulation layers 31, 41 are formed from a resin film, the upper surface 20A and the lower surface 20B of the core substrate 20 are laminated with the resin film. As the resin film is pressed, the laminated structural body is heated at a temperature that is higher than or equal to the curing temperature, which is, for example, 130° C. or higher and 200° C. or lower, to cure the resin film. This forms the insulation layers 31, 41. The process for laminating with the resin film under a vacuum atmosphere is advantageous for limiting the formation of voids. The resin film is, for example, a thermosetting resin film, the main component of which is an epoxy resin.

Alternatively, when the insulation layers 31, 41 are formed from an insulative resin liquid or paste, the insulative resin liquid or paste is applied to the upper surface 20A of the core substrate 20 and the lower surface 20B of the core substrate 20 through, for example, spin coating. The applied insulative resin is heated and cured at a temperature that is higher than or equal to the curing temperature. This forms the insulation layers 31, 41. The insulative resin liquid or paste is, for example, a thermosetting resin, the main component of which is an epoxy resin.

Before the insulation layers 31, 41 are formed, a roughening process may be performed on the wiring layers 22, 23. The roughening process roughens the surfaces of the wiring layers 22, 23 to increase the adhesiveness of the insulation layers 31, 41 and the wiring layers 22, 23, respectively. The roughening process includes, for example, blackening treatment, etching, plating, and blasting.

In the step of FIG. 3A, the through holes 31X are formed in given positions of the insulation layer 31 to partially expose the upper surface of the wiring layer 22. Also, the through holes 41X are formed in given positions of the insulation layer 41 to partially expose the lower surface of the wiring layer 23. The through holes 31X, 41X are formed, for example, through laser processing using, for example a carbon dioxide laser or a UV-YAG laser. After the through holes 31X, 41X are formed, desmear processing is performed to remove resin smears from the exposed surfaces of the wiring layers 22, 23, which are exposed in the bottom of each of the through holes 31X, 41X.

In the step of FIG. 3B, the through holes 31X of the insulation layer 31 are filled with the via wiring layer 32. Also, the wiring layer 34 is formed on the upper surface of the insulation layer 31 and electrically connected to the wiring layer 22 by the via wiring layer 32. In the same manner, the through holes 41X of the insulation layer 41 are filled with the via wiring layer. The wiring layer 42 is formed on the lower surface of the insulation layer 41 and electrically connected to the wiring layer 23 by the via wiring layer. The wiring layers 34, 42 may be formed, for example, through various kinds of wiring forming processes such as a semi-additive process or a subtractive process.

As illustrated in FIG. 4A, the first resin layer 33A is formed to cover the upper surface of the insulation layer 31 and the wiring layer 34. Also, the through holes 33X are formed in given positions of the first resin layer 33A to partially expose the upper surface of the wiring layer 34. The through holes 33X are formed, for example, through laser processing using, for example, a carbon dioxide laser or a UV-YAG laser. After the through holes 33X are formed, desmear processing is performed to remove resin smears from the exposed surfaces of the wiring layer 34, which are exposed in the bottom of each through hole 33X. The desmear processing roughens the wall surface of each through hole 33X and the upper surface SA of the first resin layer 33A. Consequently, recesses GA are formed in the upper surface SA of the first resin layer 33A.

At this time, the wall surface of each through hole 33X includes a surface formed from the insulative resin and the peripheral surface of a filler 33F. The filler 33F, the main component of which is an inorganic material such as silica or alumina, is more resistant to the laser processing and the desmear processing than the insulative resin. Thus, the wall surface of the through hole 33X has irregularities such that the peripheral surface of the filler 33F projects from the surface of the insulative resin.

In the step of FIG. 4B, the seed layer is formed to cover the entire surface of the first resin layer 33A including the wall surfaces of the through holes 33X. Then, electrolytic plating is performed using the seed layer as a power feeding layer. For example, electroless copper plating is performed to form the seed layer that covers the entire surface of the first resin layer 33A. Then, electrolytic copper plating is performed using the seed layer as the power feeding layer to form a conductive layer 35A. Consequently, the through holes 33X and the recesses GA are filled with the conductive layer 35A, which covers the upper surface SA of the first resin layer 33A. The side surface of the conductive layer 35A, which fills the through holes 33X, is shaped in conformance with the irregular surfaces, which are the wall surfaces of the through holes 33X. The side surface of the conductive layer 35A is shaped in conformance with, for example, the roughened wall surfaces of the through holes 33X formed from the insulative resin. When the peripheral surface of the filler 33F projects from the wall surfaces of the through holes 33X, the side surface of the conductive layer 35A is shaped in conformance with the peripheral surface of the filler 33F.

The volume of the conductive layer 35A may be the same as or differ from the volume of the wiring layer 50. The conductive layer 35A may be formed, for example, on the entire upper surface SA of the first resin layer 33A. The volume of the conductive layer 35A is appropriately changed in the manufacturing process of the wiring substrate 10 to reduce the warping amount of the core substrate 20.

As illustrated in FIG. 5A, a chemical mechanical polishing (CMP) process, which is one example of polishing, is performed to polish the conductive layer 35A that projects from the upper surface SA of the first resin layer 33A. Also, the upper surface SA of the first resin layer 33A including the recesses GA is polished. This forms the via wiring layer 35, which fills the through holes 33X. The polishing forms the upper end surface 35S of the via wiring layer 35 and processes the upper surface SA of the first resin layer 33A as a smooth first polished surface. In this case, the upper end surface 35S of the via wiring layer 35 impedes the polishing of the upper surface SA of the first resin layer 33A. Thus, the upper surface SA of the first resin layer 33A is upwardly curved toward the upper end surface 35S of the via wiring layer 35 around the via wiring layer 35.

Before the polishing, the upper surface SA of the first resin layer 33A has the recesses GA and the conductive material embedded in the recesses GA. However, when the polishing is performed, the recesses GA and the conductive material embedded in the recesses GA are removed from the upper surface SA of the first resin layer 33A. Even if the upper surface SA of the first resin layer 33A has the recesses GA after the polishing, the sizes of the recesses GA are sufficiently small as compared to those before the polishing. The upper surface SA of the first resin layer 33A is polished and smoothened so that after the upper end surface 35S of the via wiring layer 35 is exposed, the recesses GA and the conductive material embedded in the recesses GA are removed. In this state, the wall surfaces of the through holes 33X remain rough. Thus, the upper surface SA of the first resin layer 33A has a lower surface roughness than the wall surfaces of the through holes 33X.

The polishing process performed on the upper surface SA of the first resin layer 33A may be ended in the range where the minimum resin thickness D2 becomes zero. Alternatively, the polishing process may be continued so that the minimum resin thickness D2 becomes greater than zero. To remove the recesses GA from the upper surface SA of the first resin layer 33A, it is preferred that the upper surface SA of the first resin layer 33A continue to be polished so that the minimum resin thickness D2 becomes greater than zero. It is also preferred to remove the conductive material embedded in the recesses GA that the upper surface SA of the first resin layer 33A continue to be polished so that the minimum resin thickness D2 becomes greater than zero. When the upper surface SA of the first resin layer 33A is polished so that the minimum resin thickness D2 becomes greater than zero, the side surface of the via wiring layer 35 is partially exposed from the upper surface SA of the first resin layer 33A. In this state, the side surface of the via wiring layer 35 exposed from the upper surface SA of the first resin layer 33A is shaped in conformance with the peripheral surface of the filler 33F, that is, has the recesses 35G from which the filler 33F is separated.

As illustrated in FIG. 5B, resin varnish is applied to cover the upper surface SA of the first resin layer 33A and the upper end surface 35S of the via wiring layer 35. When the applied coating is dried and cured, the second resin layer 33B is formed. The resin varnish is, for example, a liquid in which a thermosetting resin containing an epoxy resin as the main component dissolves in solvent. The filler content rate of the resin varnish is lower than the filler content rate of the first resin layer 33A and is the same as the filler content rate of the second resin layer 33B.

The second resin layer 33B, which is formed by applying the resin varnish, includes a lower surface that is shaped in conformance with the upper surface SA of the first resin layer 33A and the upper end surface 35S of the via wiring layer 35. Also, the recesses 35G are filled with the second resin layer 33B in conformance with the side surface of the via wiring layer 35. Consequently, the boundary between the first resin layer 33A and the second resin layer 33B defines the boundary of the filler content rate. To increase the adhesiveness of the first resin layer 33A and the second resin layer 33B, it is preferred that the resin varnish forming the second resin layer 33B have the same component as the material of the first resin layer 33A. In general, the adhesiveness between the via wiring layer 35 formed from the metal material and the second resin layer 33B formed from the thermosetting resin is lower than the adhesiveness between metal layers or the adhesiveness between resin layers. In this regard, in a structure in which the recesses 35G of the via wiring layer 35 are filled with the second resin layer 33B, the recesses 35G are filled with portions of the second resin layer 33B that function as wedges. This ensures the adhesiveness between the via wiring layer 35 and the second resin layer 33B.

As illustrated in FIG. 6A, a CMP process or a mechanical polishing process, which is one example of polishing, is performed to polish the upper surface of the second resin layer 33B. The upper surface of the second resin layer 33B is polished until the upper end surface 35S of the via wiring layer 35 is exposed from the upper surface of the second resin layer 33B. Consequently, the upper surface of the second resin layer 33B is flush with the upper end surface 35S of the via wiring layer 35. Thus, the upper surface of the second resin layer 33B is processed as a smooth second polished surface. This forms the insulation layer 33, which is a lamination of the first resin layer 33A and the second resin layer 33B.

For example, when the surface roughness value Ra of the upper surface of the second resin layer 33B is 300 nm or greater and 400 nm or less before the polishing, the surface roughness value Ra of the upper surface of the second resin layer 33B is 15 nm or greater and 40 nm or less after the polishing. In other words, in this step, the upper surface of the second resin layer 33B is polished to expose the upper end surface 35S of the via wiring layer 35 and smoothen the upper surface of the second resin layer 33B. In this state, the wall surfaces of the through holes 33X remain rough. Thus, the upper surface of the second resin layer 33B has a lower surface roughness than the wall surfaces of the through holes 33X. The manufacturing steps described above manufacture the structural body corresponding to the wiring structure 11.

In the step of FIG. 6B, the seed layer 50A is formed to cover the upper surface SB of the insulation layer 33 and the upper end surface 35S of the via wiring layer 35. The seed layer 50A is formed, for example, through sputtering or electroless plating. Since the upper surface SB of the insulation layer 33 is smooth, the seed layer 50A is evenly formed on the upper surface SB of the insulation layer 33, for example, through sputtering. This allows the seed layer 50A to have a smooth upper surface. Thus, the seed layer 50A is thinner than a seed layer 50A that is formed on a rough surface through sputtering.

For example, when the seed layer 50A is formed through sputtering to cover the upper surface SB of the insulation layer 33 and the upper end surface 35S of the via wiring layer 35, titanium is accumulated on the upper surface SB and the upper end surface 35S through sputtering to form a titanium layer. Subsequently, copper is accumulated on the titanium layer through sputtering to form a copper layer. This forms the seed layer 50A having a two-layer structure. In this case, the thickness of the titanium layer may be set to, for example, 20 nm or greater and 50 nm or less. The thickness of the copper layer may be set to, for example, 100 nm or greater and 300 nm or less.

When the titanium layer is formed as a lower surface of the seed layer 50A, the adhesiveness is increased between the insulation layer 33 and the seed layer 50A. Alternatively, the titanium layer may be changed to a titanium nitride layer. This forms the seed layer 50A having a two-layer structure including the titanium nitride layer and the copper layer. Titanium and titanium nitride are metals having a higher resistance to corrosion and a higher adhesiveness to the insulation layer 33 than copper. Additionally, when electroless plating is performed to form the seed layer 50A, for example, electroless copper plating is performed to form the seed layer 50A formed only by a copper layer.

Then, a resist layer 101 is formed on the upper surface of the seed layer 50A so that the resist layer 101 includes openings 101X at given locations of the upper surface of the seed layer 50A. The openings 101X expose the seed layer 50A in regions where the wiring layer 50 is formed. The material of the resist layer 101 has, for example, the resistance to plating performed in the subsequent step. The material of the resist layer 101 is, for example, a photosensitive dry film resist or a liquid photoresist.

In the step of FIG. 7A, electrolytic plating is performed on an upper surface of the seed layer 50A using the resist layer 101 as a plating mask and the seed layer 50A as a plating power feeding layer. As a result, the metal layer 50B is formed on the upper surface of the seed layer 50A exposed from the openings 101X in the resist layer 101 through the electrolytic plating.

In the step of FIG. 7B, the resist layer 101 is removed by, for example, an alkaline removal solution. Then, unnecessary portions of the seed layer 50A exposed from gaps in the metal layer 50B are removed through etching using the metal layer 50B as an etching mask. This forms the wiring layer 50 on the upper end surface 35S of the via wiring layer 35 and the upper surface SB of the insulation layer 33.

In the step of FIG. 8A, the insulation layer 51 is formed on the upper surface SB of the insulation layer 33 to cover the wiring layer 50. Also, as illustrated in FIG. 8B, the through holes 51X are formed in the insulation layer 51 to partially expose the upper surface of the wiring layer 50.

For example, when a resin film is used as the insulation layer 51, the upper surface SB of the insulation layer 33 is laminated with the resin layer through thermocompression, and the resin film is patterned through photolithography. This forms the insulation layer 51. In this process, when the resin film is laminated under a vacuum atmosphere, the formation of voids is limited. The resin film may be, for example, a film of a photosensitive resin such as a phenol resin or a polyimide resin. When an insulative resin liquid or paste is used as the insulation layer 51, for example, the insulative resin liquid or paste is applied to the upper surface SB of the insulation layer 33 through, for example, spin coating. Then, the insulative resin is patterned through photolithography to form the insulation layer 51. The insulative resin liquid or paste may be, for example, a photosensitive resin such as a phenol resin or a polyimide resin.

The surface roughness value Ra of the insulation layer 51 formed from a photosensitive resin may be set to, for example, 2 nm or greater and 10 nm or less. That is, the upper surface of the insulation layer 51 has a lower surface roughness than the wall surfaces of the through holes 33X.

In the step of FIG. 9, the through holes 51X are filled with a via wiring layer. Additionally, the wiring layer 52 is formed on the upper surface of the insulation layer 51 and electrically connected to the wiring layer 50 by the via wiring layer. The wiring layer 52 and the via wiring layer include the seed layer, which covers the wall surfaces of the through holes 51X and the upper surface of the insulation layer 51 located around the through holes 51X, and the metal layer formed on the seed layer. The wiring layer 52 may be formed through, for example, a semi-additive process in the same steps as illustrated in FIGS. 6B to 7B. Then, the insulation layer 53, which includes the through holes 53X that partially expose the upper surface of the wiring layer 52, is formed on the upper surface of the insulation layer 51.

Additionally, the through holes 53X are filled with a metal material to form the pads P1. The manufacturing steps described above form the wiring structure 12 on the wiring structure 11.

The wiring substrate 10 and the method for manufacturing the wiring substrate 10 have the advantages described below.

Figure 10:
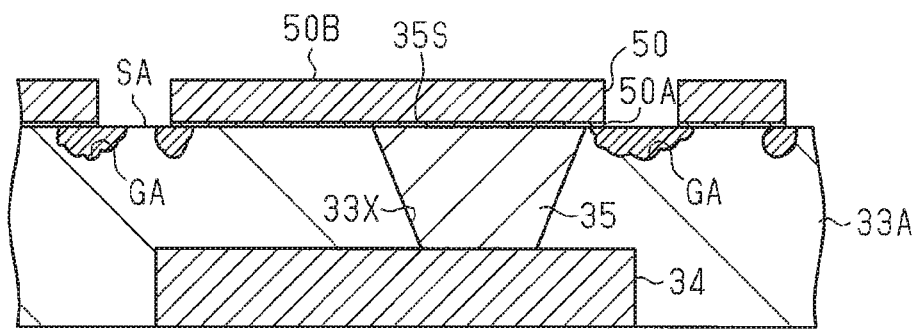
FIG. 10 is a partially enlarged cross-sectional view illustrating the structure of a reference example of a wiring substrate.

To facilitate understanding of the advantages of the wiring substrate 10, FIG. 10 illustrates a reference example of a wiring substrate in which the layer corresponding to the insulation layer 33 is formed only by the first resin layer 33A. The wiring substrate of the reference example is obtained by omitting the step of polishing the upper surface SA so as to be upwardly curved toward the upper end surface 35S of the via wiring layer 35 and the step for forming the second resin layer 33B.

As illustrated in FIG. 10, the recesses GA are formed in the upper surface SA of the first resin layer 33A through desmear processing. The conductive material that forms the via wiring layer 35 is embedded in each of the recesses GA. The polishing that forms the upper end surface 35S of the via wiring layer 35 is a process for polishing the conductive material. Thus, as illustrated in FIG. 10, the conductive material embedded in the recesses GA of the first resin layer 33A remains in the recesses GA even after the step of forming the upper end surface 35S of the via wiring layer 35 is performed.

If the wiring layer 50 is formed with the conductive material embedded in the recesses GA, the recesses GA may be located between wiring patterns of the wiring layer 50 that are adjacent to each other. When a recess GA is located between adjacent wiring patterns, the lower surfaces of the adjacent wiring patterns have a tendency to be electrically connected to each other by the conductive material embedded in the recess GA. Thus, the adjacent wiring patterns may be short-circuited. This hinders the increases of the throughput yield for manufacturing the wiring substrates.

In this regard, as illustrated in FIG. 1B, in the wiring substrate 10, when the upper surface SA of the first resin layer 33A is polished, the first resin layer 33A is processed so as to downwardly recess from the upper end surface 35S of the via wiring layer 35. The second resin layer 33B is embedded in the recesses of the first resin layer 33A. When the second resin layer 33B is polished, the upper surface of the second resin layer 33B becomes flush with the upper end surface 35S of the via wiring layer 35. This results in the removal of the recesses GA, which are located in the upper surface SA of the first resin layer 33A, and the conductive material embedded in the recesses GA. The second resin layer 33B electrically insulates the lower surfaces of adjacent wiring patterns of the wiring layer 50.

The recesses GA are formed in the upper surface SA of the first resin layer 33A, for example, when the filler is separated from the first resin layer 33A, in addition to when the upper surface SA is roughened by the desmear processing. If the filler is separated from the first resin layer 33A before the via wiring layer 35 is formed, the conductive material is embedded in recesses formed by the filler separation in the same manner as when the upper surface SA is roughened by the desmear processing. This results in the short-circuiting of adjacent wiring patterns of the wiring layer 50 and hinders the increases of the throughput yield for manufacturing the wiring substrates. Additionally, if the filler is separated from the first resin layer 33A after the via wiring layer 35 is formed, the seed layer 50A is not easily formed in the recesses formed by the filler separation. As a result, the recesses formed by the filler separation remain in the upper surface SA. This impedes the formation of the wiring layer 50 and hinders the increases of the throughput yield for manufacturing the wiring substrates. Additionally, when the filler separation occurs in a gap between adjacent wiring patterns of the wiring layer 50, migration tends to occur in the adjacent wiring patterns even if the insulation layer 51 is embedded in the recesses formed by the filler separation.

In this regard, in the wiring substrate 10, the filler content rate of the second resin layer 33B is lower than the filler content rate of the first resin layer 33A. This limits decreases of the throughput yield that are caused by at least one of the formation of the recesses GA as a result of the desmear processing and the filler separation.

The structure of a semiconductor device 70 will now be described.

Figure 11:
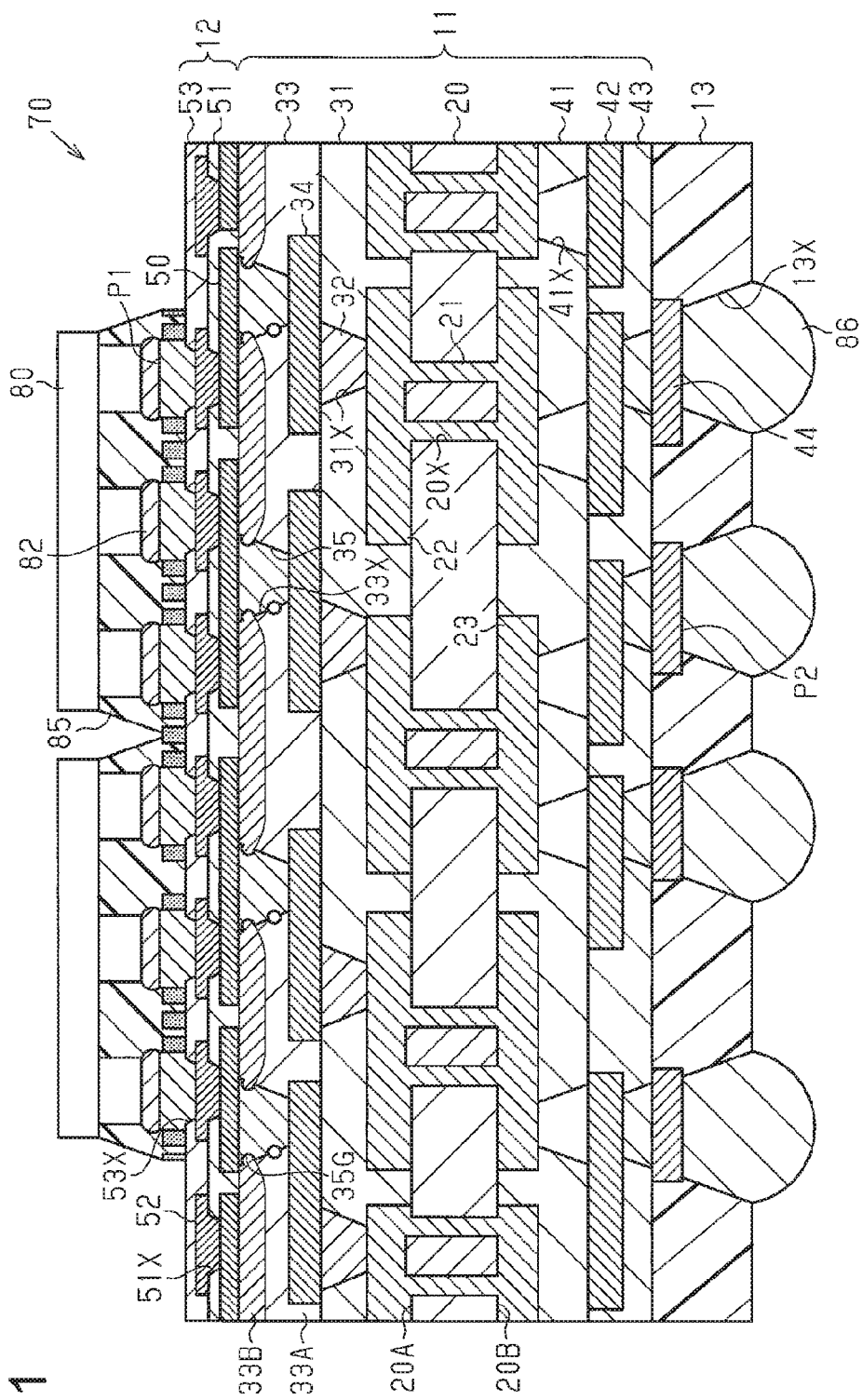
FIG. 11 is a cross-sectional view illustrating the structure of a semiconductor device that includes the wiring substrate of FIG. 1.

As illustrated in FIG. 11, the semiconductor device 70 includes the wiring substrate 10, one or more (two in FIG. 11) semiconductor chips 80, an underfill resin 85, and external connection terminals 86.

The semiconductor chips 80 are flip-chip-mounted on the wiring substrate 10. Bumps 82 are arranged on a lower surface of each of the semiconductor chips 80 defining a circuit formation surface. The bumps 82 are joined to the pads P1 of the wiring substrate 10. The bumps 82 electrically connect the semiconductor chips 80 to the wiring layer 52.

The semiconductor chips 80 are each, for example, a logic chip such as a central processing unit (CPU) chip or a graphics processing unit (GPU) chip. Alternatively, the semiconductor chips 80 may each be, for example, a memory chip such as a dynamic random access memory (DRAM) chip, a static random access memory (SRAM) chip, or a flash memory. Further, semiconductor chips 80 having the combination of a logic chip and a memory chip may be mounted on the wiring substrate 10.

The size of each semiconductor chip 80 is, for example, in a range of 3 mm×3 mm to 12 mm×12 mm in a plan view. The thickness of the semiconductor chip 80 is, for example, 50 μm or greater and 100 μm or less.

The bumps 82 are each, for example, a gold bump or a solder bump. The material of the solder bump is, for example, an alloy containing lead, an alloy of tin and gold, an alloy of tin and copper, an alloy of tin and silver, and an alloy of tin, silver, and copper.

The gap between the wiring substrate 10 and the semiconductor chips 80 is filled with the underfill resin 85. The material of the underfill resin 85 is, for example, an insulative resin such as an epoxy resin.

The external connection terminals 86 are located on lower surfaces of the external connection pads P2 of the wiring substrate 10. The external connection terminals 86 are electrically connected to, for example, pads located on a mount board such as a motherboard. The external connection terminals 86 are each, for example, a solder ball or a lead pin. In the present example, solder balls are used as the external connection terminals 86.

A method for manufacturing the semiconductor device 70 will now be described.

The solder balls are arranged on the external connection pads P2 and fixed to the external connection pads P2 at a temperature of, for example, 240° C. or higher and 260° C. or lower. The semiconductor chips 80 are mounted on the wiring substrate 10. In the present example, the bumps 82 of the semiconductor chips 80 are flip-chip-mounted on the pads P1 of the wiring substrate 10. The gap between the semiconductor chips 80 and the wiring substrate 10, which are flip-chip-bonded to each other, is filled with the underfill resin 85. The underfill resin 85 is cured. The manufacturing steps described above manufacture the semiconductor device 70.

The present embodiment has the advantages described below.

(1) The through holes 33X are formed in the first resin layer 33A so that the via wiring layer 35 is embedded in the through holes 33X to electrically connect the wiring layer 34 and the wiring layer 50. After the through holes 33X are formed in the first resin layer 33A, the desmear processing is performed on the wall surfaces of the through holes 33X and the upper surface SA of the first resin layer 33A. The desmear processing polishes and removes the recesses GA, which are formed in the upper surface SA, when forming the upper end surface 35S of the via wiring layer 35. The upper surface SB of the insulation layer 33, which functions as the base layer for the wiring layer 50, is defined by the upper surface of the second resin layer 33B. The second resin layer 33B is formed after the desmear processing is performed to form the through holes 33X. This limits the recesses GA and the conductive material, which is embedded in the recesses GA, remaining in the upper surface SB of the insulation layer 33 that serves as the base layer of the wiring layer 50. Thus, the throughput yield for manufacturing the wiring layers is increased.

(2) The filler content rate of the second resin layer 33B is lower than the filler content rate of the first resin layer 33A. This limits the decreases of the throughput yield caused by the separation of the filler from the insulation layer 33.

(3) When the minimum resin thickness D2 is greater than zero, the polishing amount of the upper surface SA of the first resin layer 33A is increased. Thus, the recesses GA that are formed in the upper surface SA of the first resin layer 33A are easily removed. This limits the conductive material that remains between the first resin layer 33A and the second resin layer 33B.

(4) To ensure the electrical connection of the via wiring layer 35 and the wiring layer 50, the lower surface of the wiring layer 50 is normally designed to be larger than the upper end surface 35S of the via wiring layer 35 to have a given margin. Short-circuiting of adjacent wiring patterns of the wiring layer 50 corresponds to short-circuiting of the lower surfaces of the adjacent wiring patterns. Such short-circuiting occurs at a position separated from the upper end surface 35S of the via wiring layer 35 by the margin or more. In this regard, the second resin layer 33B is thinner at positions closer to the via wiring layer 35 and thicker at positions more distant from the via wiring layer 35. Thus, the conductive material embedded in the recesses GA is removed more assuredly from portions of the second resin layer 33B that is greater in thicknesses. Thus, the conductive material embedded in the recesses GA are removed more assuredly from positions where adjacent wiring patterns of the wiring layer 50 have a tendency to short-circuit. The conductive material located between the first resin layer 33A and the second resin layer 33B is not directly connected to the wiring layer 50 but may affect signals transmitted through the wiring layer 50. In this regard, the thickness of the second resin layer 33B increases at positions more distant from the via wiring layer 35. Thus, the advantage that increases the throughput yield as described in advantage (1) is further clearly obtained.

It should be apparent to those skilled in the art that the foregoing embodiments may be employed in many other specific forms without departing from the scope of this disclosure. Particularly, it should be understood that the foregoing embodiments may be employed in the following forms.

The polishing performed on the upper surface SA of the first resin layer 33A diminishes each recess GA. Thus, the polishing performed on the upper surface SA of the first resin layer 33A may allow the diminished recesses GA to remain in the upper surface SA of the first resin layer 33A that has been polished. The conductive material may be embedded in the diminished recesses GA. Alternatively, the second resin layer 33B may be embedded in the diminished recesses GA. These structures also limit the formation of the recesses GA in the upper surface SB of the insulation layer 33. Thus, advantages (1) to (4) are obtained.

Before the seed layer 50A is formed, a plasma process such as oxygen plasma asking may be performed on the upper surface SB of the insulation layer 33. The plasma process roughens the upper surface SB of the insulation layer 33. The roughened upper surface SB of the insulation layer 33 increases the adhesiveness of the seed layer 50A and the insulation layer 33. However, when the roughness of the upper surface SB of the insulation layer 33 is reduced to improve the smoothness, fine wirings are allowed to be formed on the upper surface SB of the insulation layer 33. Therefore, the plasma process is performed to roughen the upper surface SB of the insulation layer 33 to an extent that does not interfere with the formation of fine wirings performed in a subsequent step. This process also limits conductive materials other than the wiring layer 50 that remain in the upper surface SB of the insulation layer 33. Thus, advantages (1) to (4) are obtained.

As viewed in a direction opposed to the insulation layer 33, that is, in a plan view, the density of the via wiring layer 35 per unit area may be uniform or differ from one unit region to another. When the density of the via wiring layer 35 per unit area differs from one another, the shape of the upper surface SA of the first resin layer 33A may differ, for example, from one unit region to another. For example, in a unit region where the density of the via wiring layer 35 per unit area is high, the minimum resin thickness D2 is small. In a unit region where the density of the via wiring layer 35 per unit area is low, the minimum resin thickness D2 is large.

The material of each of the insulation layers 31, 33 may be changed to, for example, a photosensitive insulative resin, the main component of which is a phenol resin or a polyimide resin.

When forming the through holes 33X, the wall surface of each through hole 33X may not include the peripheral surface of the filler 33F. When the wall surface of the through hole 33X does not include the peripheral surface of the filler 33F, the side surface of the via wiring layer 35 that fills the through hole 33X does not include the recesses 35G and is a continuous surface. Accordingly, the second resin layer 33B does not include a portion that fills the recesses 35G. When the upper surface SA of the first resin layer 33A is polished so that the minimum resin thickness D2 becomes zero, the filler 33F extending in the side surface of the via wiring layer 35 is not easily separated from the side surface of the via wiring layer 35. Therefore, to increase the adhesiveness of the via wiring layer 35 and the second resin layer 33B using the recesses 35G, it is preferred that the minimum resin thickness D2 be greater than zero.

The two-layer structure including the first resin layer 33A and the second resin layer 33B may be applied to the insulation layer 31. When the two-layer structure including the first resin layer 33A and the second resin layer 33B is applied to each of the insulation layers 31, 33, the flatness of the upper surface SB of the insulation layer 33 is further easily obtained. The formation of the recesses GA and the filler separation significantly lower the reliability of wiring layers in the high density wiring layer, in which wiring patterns are separated by small gaps. Thus, when the two-layer structure including the first resin layer 33A and the second resin layer 33B is applied to the insulation layer 33, advantages (1) to (4) are further clearly obtained.

Clause

This disclosure further encompasses the following embodiment.

1. A method for manufacturing a wiring substrate, the method including:

forming a first wiring layer;

covering the first wiring layer with a first resin layer formed from an insulative resin;

forming a via wiring layer that is extended through the first resin layer and connected to the first wiring layer;

polishing an upper surface of the first resin layer to form the upper surface of the first resin layer as a first polished surface that is upwardly curved toward an upper end surface of the via wiring layer;

covering the upper end surface of the via wiring layer and the first polished surface with a second resin layer that is formed from an insulative resin and has a lower filler content rate than the first resin layer;

polishing an upper surface of the second resin layer to form the upper surface of the second resin layer as a second polished surface that is flush with the upper end surface of the via wiring layer; and forming a second wiring layer, which is connected to the upper end surface of the via wiring layer and has a higher wiring density than the first wiring layer, on the second polished surface.

All examples and conditional language recited herein are intended for pedagogical purposes to aid the reader in understanding the principles of the invention and the concepts contributed by the inventor to furthering the art, and are to be construed as being without limitation to such specifically recited examples and conditions, nor does the organization of such examples in the specification relate to an illustration of the superiority and inferiority of the invention. Although embodiments have been described in detail, it should be understood that various changes, substitutions, and alterations could be made hereto without departing from the scope of this disclosure.

The invention claimed is:

1. A wiring substrate comprising:
   a first wiring layer;
   a first insulation layer that is formed from an insulative resin and covers the first wiring layer;
   a second wiring layer located on an upper surface of the first insulation layer;
   a second insulation layer that is formed from an insulative resin and covers the first insulation layer and the second wiring layer; and
   a via wiring layer that extends through the first insulation layer and connects the first wiring layer to the second wiring layer, wherein the via wiring layer includes an upper end surface that is connected to the second wiring layer and flush with the upper surface of the first insulation layer, wherein
   the second wiring layer has a higher wiring density than the first wiring layer,
   the first insulation layer includes
       a first resin layer that contains a filler, and a second resin layer that is located on an upper surface of the first resin layer and has a lower filler content rate than the first resin layer, an upper surface of the second resin layer is the upper surface of the first insulation layer, and the upper surface of the first resin layer is a curved surface that is upwardly curved toward the upper end surface of the via wiring layer so that the second resin layer has a thickness that decreases at portions closer to the via wiring layer.

2. The wiring substrate according to claim 1, wherein the upper surface of the first resin layer and the upper surface of the second resin layer are separate polished surfaces.

3. The wiring substrate according to claim 1, wherein the upper surface of the first resin layer is located at a lower position than the upper end surface of the via wiring layer.

4. The wiring substrate according to claim 1, wherein the first insulation layer is formed from a non-photosensitive insulative resin and the second insulation layer is formed from a photosensitive insulative resin.

5. The wiring substrate according to claim 1, wherein the second insulation layer contains a filler and the filler content rate of the second resin layer is zero.

6. A semiconductor device comprising:
the wiring substrate of claim 1; and
a semiconductor chip that is flip-chip-mounted on the wiring substrate.

* * * * *